United States Patent [19]

Weaver et al.

[11] Patent Number: 4,873,069

[45] Date of Patent: Oct. 10, 1989

[54] METHOD FOR THE PREPARATION OF SILICON CARBIDE WHISKERS

[75] Inventors: Samuel C. Weaver; Richard D. Nixdorf, both of Knoxville, Tenn.

[73] Assignee: American Matrix, Inc., Knoxville, Tenn.

[21] Appl. No.: 284,910

[22] Filed: Dec. 15, 1988

Related U.S. Application Data

[63] Continuation-in-part of Ser. No. 23,673, Mar. 9, 1987, abandoned.

[51] Int. Cl.$^4$ ................................................ C01B 3/36
[52] U.S. Cl. .................................... 423/345; 156/603; 156/DIG. 64; 156/DIG. 112
[58] Field of Search ................................ 423/345, 346; 156/DIG. 64, DIG. 112, 603

[56] References Cited

U.S. PATENT DOCUMENTS

| | | | |
|---|---|---|---|
| 3,692,478 | 9/1972 | Knippenberg et al. | 423/345 |
| 3,754,076 | 8/1973 | Kutler | 423/345 |
| 3,933,984 | 1/1976 | Kimura et al. | 423/345 |
| 4,248,844 | 2/1981 | Ramsay et al. | 423/345 |
| 4,249,700 | 2/1981 | Pareuh et al. | 423/345 |
| 4,283,375 | 8/1981 | Horne et al. | 423/345 |
| 4,284,612 | 8/1981 | Horne, Jr. et al. | 423/345 |
| 4,500,504 | 2/1985 | Yamamoto | 423/345 |
| 4,504,453 | 3/1985 | Tanaka et al. | 423/345 |
| 4,591,492 | 5/1986 | Tanaka et al. | 423/345 |
| 4,605,542 | 8/1986 | Harada | 423/345 |

FOREIGN PATENT DOCUMENTS 2168333  6/1986  United Kingdom ................ 423/345

*Primary Examiner*—Asok Pal
*Attorney, Agent, or Firm*—Pitts and Brittian

[57] ABSTRACT

A method for achieving a high yield of beta silicon carbide whiskers. According to this method, very small (e.g., 0.002 microns) fluffy silicon dioxide particles having a very large surface area (e.g., 200 m$^2$/g) are mixed with a fluffy carbonized material. These materials have a void volume of about 40 percent or greater. The silicon dioixde is present in an amount by weight approximately twice that of the carbon constituent. This mixture is heated, preferably in the presence of a catalyst (e.g., anhydrous boric oxide and powdered aluminum metal) at a temperature of about 1650°±300° C. for a time of one-half to four hours. During this heating the gaseous reaction products are maintained at a steady state as with a low flow of argon gas through the furnace. The resultant SiC whiskers have a diameter in the range of about 0.5 to 10 micrometers, and a length of about 10 to about 1000 micrometers. These SiC whiskers are principally beta phase silicon carbide and the whiskers have a smooth surface morphology. The effects of the variables are described.

15 Claims, No Drawings

METHOD FOR THE PREPARATION OF SILICON CARBIDE WHISKERS

This is a continuation-in-part application based upon parent patent application Ser. No. 23,673 filed Mar. 9, 1987, now abandoned.

DESCRIPTION

1. Technical Field

This invention relates generally to the preparation of whiskers of carbide-type materials, and more particularly to a method for the preparation of the silicon carbide whiskers.

2. Background of the Invention

The term "whiskers", as used herein, is to be understood to apply to crystalline structures having an average thickness of about 1 to a few micrometers, and a length about 10-100 times larger than the thickness. Many types of these whiskers have been found to be useful in industrial applications due to the very high mechanical strength possessed by such structures. This strength is considerably greater than that of polycrystalline fibrous material consisting of the same substance as the whiskers. The whiskers typically are used to reinforce ceramic, metal, or polymer bodies, for example.

The whisker crystal can consist of metals, metal carbides, metal oxides, metal borides, metal nitrides, etc. One of the most widely used of these whisker materials is silicon carbide. Because of its importance, numerous processes have been developed for the production of these silicon carbide whiskers. For example, U.S. Pat. No. 3,692,478, issued to W. F. Knippenberg on Sept. 19, 1972, relates to reacting a specially-produced silicon carbide substrate with hydrogen gas within a graphite crucible with the whiskers being grown on the substrate. Another patented process is described in U.S. Pat. No. 3,754,076, issued to I. B. Cutler on Aug. 21, 1973. In that process rice hulls, which naturally contain both silicon and carbon, are heated at elevated temperatures in the absence of oxygen to produce the silicon carbide whiskers. The reaction is preferably catalyzed by certain transition elements. In another patent, U.S. Pat. No. 3,933,984, issued to I. Kimura, et al., on Jan. 20, 1976, finely divided silicon dioxide in an organic material is reacted with a chlorine-containing gas plus an aliphatic hydrocarbon.

Still other patents have been obtained in this field. Typical are U.S. Pat. No. 4,248,844, issued to D. E. Ramsey, et al., on Feb. 3, 1981; U.S. Pat. No. 4,249,700, issued to B. K. Parekh on Feb. 10, 1981; U.S. Pat. Nos. 4,283,375 and 4,284,612, issued to O. J. Horne, Jr., et al., on Aug. 11, 1981; U.S. Pat. No. 4,500,504, issued to A. Yamamoto on Feb. 19, 1985; and U.S. Pat. No. 4,605,542, issued Aug. 12, 1986, to J. Harada.

One of the problems encountered in following any of the processes described in the literature is the matter of yield: the percentage of product obtained by the process. Another is the matter of obtaining whiskers having a uniformity of size. Also, some of the processes require rather extreme conditions and/or expensive raw materials. Thus, a simplified process is desired which overcomes these and other disadvantages of the prior art.

It is therefore one object of the present invention to produce substantially uniform silicon carbide whiskers.

It is another object of the present invention to provide a method for producing silicon carbide whiskers, the method producing a high yield of the product.

It is also an object to provide a method for producing silicon carbide whiskers that are substantially beta-phase silicon carbide.

A further object of the present invention is to provide a process which produces silicon carbide whiskers having a substantially smooth surface morphology.

These and other objects of the present invention will become apparent upon a consideration of the full description of the invention hereinafter.

SUMMARY OF THE INVENTION

In accordance with the present invention, a fluffy silica ($SiO_2$) "fiber" (small particles joined in a 3-D chain) having extremely small size and very large surface area is blended with high volume carbonized cotton. These are preferably mixed with a catalyst, typically in the form of anhydrous boric oxide ($B_2O_3$), powdered aluminum metal or a mixture of powdered aluminum metal and $B_2O_3$, and then heated to a temperature of about 1350° to about 1900° C. for about 0.2 to 4 hours. The gaseous products of the reaction are maintained at a steady state as with a flowing argon gas through the reaction furnace. A preferred blend of starting materials is, by weight, ten parts of the silicon dioxide, five parts of the carbonized material, one part $B_2O_3$ and about 0.25 parts aluminum metal. The resultant silicon carbide whiskers are 0.5-10 micrometers in diameter and 10-1000 micrometers in length. The diameter and length can be adjusted through an adjustment of time, the $SiO_2$ proportion and the $B_2O_3$ proportion. These whiskers are betaphase silicon carbide and have a smooth surface morphology.

BEST MODE FOR CARRYING OUT THE INVENTION

A method for producing a high yield of satisfactory silicon carbide whiskers has been developed using, as the starting materials, very small particles of silicon dioxide ($SiO_2$) and very small particles of carbonized carbon-containing materials. Not only must these particles be small, they must also be very fluffy (very high void volume). Only in this way will there be space for free growth of the whiskers during the reaction.

An especially useful starting material for the $SiO_2$ is a product manufactured by Cabot Corporation, Tuscola, Ill. This product is "Cab-O-Sil" and, according to Cabot literature, is produced by the hydrolysis of silicon tetrachloride vapor in a flame of hydrogen and oxygen. Residual HCl is then reduced by calcination. This results in a 3-D fiber or chain-like structure of interconnected spheres of silica and thus a high void volume. Void volume is defined as the percent of space not occupied by solids. As used herein, the term "fluffy" relates to materials having a void volume of about 40 percent or greater. Typically, there will be a range of about 40 to about 98 percent in the preferred materials. Optimum results are obtained with materials having a void volume in the upper portion of this range, e.g., 80-98 percent. The average diameters of the spheres range from 7-14 millimicrons, and the product has surface areas ranging from about 200 to 400 square meters per gram. The maximum lengths of the aggregates of the silica spheres are a few tenths of a micron. Other $SiO_2$ starting material having these small sizes (5-15 millimicrons) and large surface area, and resulting void volume, are expected to produce a high yield of suitable silicon carbide whiskers.

As stated, the carbon source for the method of the present invention must also be fluffy (high void volume) and have very small size (a few tenths of a micron). One such product is a carbonized cotton fiber as manufactured by American Matrix, Knoxville, Tenn., and designated as PFX carbon. This is produced from cotton fibers which are carbonized in an inert atmosphere at about 900° C. Actually, carbonization can be carried out in a temperature range of about 400° to 3000° C. This product has a ribbon-type structure having a diameter of about 4–15 microns (average about 8–10 microns), and a length of a few millimeters (average about 2 mm). Other carbonized fibers, such as rayon fibers carbonized under the same conditions, can be used.

Although a mixture of the above-described materials when heated for a preferred time at a preferred temperature (as set forth below) results in the formation of some silicon carbide whiskers, a significant increase in yield is achieved when a catalyst is added. Of particular value is boron added as anhydrous boric oxide ($B_2O_3$) which increases the yield to over 50%. Other possible catalysts are decomposable compounds of aluminum and lanthanum. The addition of powdered aluminum metal, either alone, or with the $B_2O_3$, is also effective in increasing the yield. The two catalysts together increase the yield to at least 80%. Nearly 100% of the SiC is beta phase. In addition to affecting yield, the length and diameter of the whiskers are affected by the proportion of the catalyst as described in more detail below. The addition of the powdered aluminum metal produces a stronger fiber and a smoother surface on the fibers: both qualities are beneficial for the strengthening of ceramics.

The composition of the starting mixture was investigated to determine an optimum composition and the affects of deviation from that optimum. A preferred composition of a starting mix is ten (10) parts by weight Cab-O-Sil silica (or equivalent), five (5) parts by weight carbonized cotton (or equivalent), one (1) part by weight of anhydrous boric oxide and about 0.25 parts aluminum metal. A high yield of silicon carbide whiskers results when this preferred mix is rapidly heated to 1700±50° C. and then held at temperature for at least thirty (30) minutes. However, silicon carbide whiskers were formed even after about 10 minutes. With this same mixture, it was found that the yield was low at 1600° C. The diameter of the whiskers continues to grow when heating times are increased reaching a maximum after about two hours. However, heating can continue up to four hours. Temperatures above about 1900° C. result in a change in structure (from beta to alpha phase) of the silicon carbide whiskers. Temperatures of about 2100° C. produce platelets (as described in patent application Ser. No. 80,401, filed July 31, 1987, now abandoned) rather than whiskers.

A reduction of the $SiO_2$ content is quite detrimental to the method. As the $SiO_2$ content is decreased, the resultant whiskers are shorter in length, the yield is less and there is residual carbon in the product. When the $SiO_2$ is increased, the yield is again lowered and some glassy $SiO_2$ is observed in the product. Accordingly, a practical range of about 9 to 11 parts by weight of the $SiO_2$ material has been established. This range then results in a range of 4–6 parts by weight of the carbon starting material.

The effect of the quantity of catalyst was studied, based upon the use of boric oxide. As stated above, one preferred mixture contains one (1) part by weight. As the concentration of $B_2O_3$ is increased, the yield increases. However, the diameter of the whiskers increases and the length of the whiskers decrease. Accordingly, an optimum range of $B_2O_3$ appears to be from about 0.5 part to about 1.5 parts based upon the total mixture with the $SiO_2$ and carbon starting materials.

Larger-scale production of silicon carbide whiskers (furnace loadings of about 750 grams), wherein $B_2O_3$ was used alone as the catalyst, produced a considerable amount (10–30%) of alpha-phase silicon carbide. However, a substantially pure beta-phase single crystal is preferred for its increased strength. It was found that as little as 0.2 to 0.35 parts of powdered aluminum metal, when added to the $B_2O_3$, increases the yield of beta-phase silicon carbide whiskers to substantially 100%. Also, as indicated above, the aluminum metal produces a surface morphology that is much smoother. Furthermore, when the powdered aluminum metal is added with the $B_2O_3$, the reaction can be carried out at unexpected lower temperatures, e.g., as low as 1350° C.

The surface texture (morphology) of the resultant silicon carbide whiskers is also affected by the ratio of the principal ingredients. Accordingly, rough-surfaced whiskers can be produced for use in strengthening metal and polymeric bodies, or smooth-surfaced whiskers can be produced for use in ceramic bodies.

In order to assure the growth of the whiskers as the reactions proceed, the gaseous products of the reaction must be maintained at steady state at the surface. The principal reaction is thought to be:

$$SiO_2 + 3C \rightarrow SiC + 2CO$$

Intermediate reactions may be:

$$2SiO_2 + 2C \rightarrow 2SiO + 2CO$$

$$SiO \rightarrow Catalyst \rightarrow Si + SiO_2$$

$$Si + CO \rightarrow SiO + C$$

ti $Si + C \rightarrow SiC$

It has been found that flowing argon gas slowly through the furnace is effective in maintaining a steady state of the gaseous products of the reaction. If the CO is not removed the reaction stops, and if the CO is removed too rapidly (high rate of argon flow) whiskers will not form. Typically, the flow rate is 20 feet$^3$/hour although this will vary upon the particular construction of the furnace. Persons skilled in the art will recognize proper control of the steady state of the reaction products. Although not investigated, helium is expected to serve a similar function. It was demonstrated that natural gas inhibits the SiC reaction, that vacuum was not effective, and that nitrogen gas also was not effective.

The silicon carbide whiskers produced by the method described above are principally beta phase silicon carbide whiskers. Generally the beta phase silicon carbide whiskers have an aspect ratio (length/diameter) about one-half (50–100) the value of alpha phase silicon carbide whiskers. (100–200). These beta phase silicon carbide whiskers produced by the present method have diameters in a range of about 0.5 to 10 micrometers, and lengths ranging from about 10 to about 1000 micrometers.

From the foregoing, it will be understood by those versed in the art that a method has been described for producing a high yield of beta silicon carbide whiskers. This is accomplished through the choice of a rather narrow range of composition of a mixture of very fine particles of $SiO_2$ and carbon that have an extremely fluffy structure and thus a high void volume. Furthermore, the method is benefited by the presence of a catalyst (in particular, anhydrous boric oxide with powdered aluminum metal), and gaseous reaction products must be maintained at steady state so that the desired reaction is not inhibited. The whiskers produced by this method are not firmly bonded and thus can be separated into individual whiskers.

Although only specific materials are discussed herein, the invention is not to be limited to those materials. Rather, the invention is to be limited only by the appended claims and their equivalents.

We claim:

1. A method for producing a high yield of silicon carbide whiskers having diameters of about 0.5 to about 10 micrometers and lengths of about 10 to about 1000 micrometers, which comprises:
   preparing a mixture of silicon dioxide particles and carbon fibers, said silicon dioxide particles having an average diameter of about 5 to 15 millimicrons and an average surface area of about 200 to 400 square meters per gram, said silicon dioxide particles being about 1.5 to about 2.75 times, by weight, said carbon fibers and said silicon dioxide having a void volume of about 40 percent to about 98 percent;
   heating said mixture to a temperature of about 1600° to 1900° C. in a furnace for a time at least about 0.2 hours, followed by cooling to room temperature; and
   maintaining gaseous reaction products of reactions between said silicon dioxide and said carbon fibers at the surface of said mixture at a steady state condition during said heating by flowing a substantially inert gas through said furnace.

2. The method of claim 1 further comprising mixing a catalyst with said silicon carbide particles and said carbon fibers prior to said heating, said catalyst being about 3 to 10 percent by weight based upon the combined weight of said silicon dioxide and carbon fibers.

3. The method of claim 2 wherein said mixture comprises ten parts by weight said silicon dioxide powder, five parts by weight said carbon fibers, and one part said catalyst; and wherein said heating is carried out at about 1600°-1900° C. for 0.2 to 2 hours.

4. The method of claim 2 wherein said catalyst is selected from the group consisting of aluminum metal and decomposable compounds of boron, aluminum, and lanthanum and mixtures thereof.

5. The method of claim 1 wherein said carbon fibers are carbonized cotton fibers.

6. The method of claim 1 wherein said inert gas is selected from argon and helium.

7. The method of claim 6 wherein said inert gas is argon.

8. A method of producing a high yield of beta silicon carbide whiskers having diameters of about 0.5 to about 5 micrometers and lengths of about 10 to about 100 micrometers, which comprises:
   preparing a mixture of
   a. 9-11 parts by weight of silicon dioxide particles having an average size of about 5 to 15 millimicrons and a surface area of about 200 to 400 square meters per gram, said silicon dioxide having a void volume of about 40 percent or greater,
   b. 4-6 parts by weight of carbonized cotton fibers having a void volume of about 40 percent or greater, and
   c. 0.5 to 1.5 parts by weight of a catalyst selected from aluminum metal, and oxides of boron, aluminum and lanthanum;
   heating said mixture in a furnace at a temperature of about 1350° to about 1950° C. for 0.5 to 4 hours; and
   maintaining gaseous products of reactions between said silicon dioxide and carbonized cotton fibers at the surface of said mixture at a steady state with a flow of argon gas through said furnace.

9. The method of claim 8 wherein said silicon dioxide particles are produced by the hydrolysis of silicon tetrachloride vapor in a flame of hydrogen and oxygen, and residual hydrogen chloride is removed by calcination.

10. The method of claim 8 wherein said carbonized cellulose fibers are produced by carbonizing cotton in an inert atmosphere at about 400° C. to about 3000° C.

11. The method of claim 8 wherein said catalyst is anhydrous boric oxide.

12. The method of claim 8 wherein said catalyst is a mixture of anhydrous boric oxide and powdered aluminum metal.

13. The method of claim 8 wherein said mix comprises:
   ten parts by weight of said silicon dioxide particles;
   five parts by weight of said carbonized cotton particles;
   one part by weight of said anhydrous boric oxide; and
   about 0.2 to 0.35 parts said powdered aluminum metal catalyst.

14. A method of producing a high yield of smooth surface beta silicon carbide whiskers having diameters of about 0.5 to about 10 micrometers and lengths of about 10 to about 1000 micrometers, which comprises:
   preparing a mixture of
   a. 9-11 parts by weight of silicon dioxide particles having an average diameter of about 5 to 15 millimicrons and a surface area of about 200 to 400 square meters per gram, said silicon dioxide produced by the hydrolysis of silicon tetrachloride in a flame of hydrogen and oxygen, with residual hydrogen chloride removed by calcination said silicon dioxide having a void volume of about 80-98 percent,
   b. 4-6 parts by weight of carbonized cotton fibers, said carbonized cotton fibers produced by carbonizing cotton fibers in a hydrogen atmosphere at about 900° C., said carbonized cotton fibers having a void volume of about 80-98 percent,
   c. 0.1 to 1.5 parts by weight of anhydrous boric oxide as a catalyst, and
   d. 0.2 to 0.35 parts by weight of aluminum metal powder as a further catalyst,
   heating said mixture in a furnace at a temperature of about 1350° to 1950° C. for about 0.5 to 4 hours; and
   maintaining gaseous products of reactions between said silicon dioxide and said carbonized cotton fibers on the surface of said mixture with a flowing stream of argon gas.

15. The method of claim 14 wherein said mix comprises:
   ten parts by weight of said silicon dioxide particles;
   five parts by weight of said carbonized cotton fibers;
   one part by weight of said boric oxide catalyst; and
   0.25 part by weight of said powdered aluminum metal.

* * * * *